(12) United States Patent
Nishimura (10) Patent No.: US 8,608,974 B2
(45) Date of Patent: Dec. 17, 2013

(54) SUBSTRATE PROCESSING METHOD

(75) Inventor: Eiichi Nishimura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 40 days.

(21) Appl. No.: 13/332,531

(22) Filed: Dec. 21, 2011

(65) Prior Publication Data
US 2012/0164839 A1   Jun. 28, 2012

Related U.S. Application Data

(60) Provisional application No. 61/432,772, filed on Jan. 14, 2011.

(30) Foreign Application Priority Data

Dec. 24, 2010  (JP) ................................. 2010-287595

(51) Int. Cl.
C23F 1/00  (2006.01)

(52) U.S. Cl.
USPC ............................................. 216/78; 216/67

(58) Field of Classification Search
None
See application file for complete search history.

(56) References Cited

U.S. PATENT DOCUMENTS

| 6,008,140 A | 12/1999 | Ye et al. |
| 2005/0170642 A1 | 8/2005 | Hineman et al. |
| 2006/0035173 A1 | 2/2006 | Davidson et al. |
| 2006/0105575 A1* | 5/2006 | Bailey et al. ................. 438/706 |
| 2007/0222076 A1 | 9/2007 | Fukasawa et al. |
| 2009/0011597 A1* | 1/2009 | Futase et al. ................. 438/686 |

FOREIGN PATENT DOCUMENTS

JP   06-204186 A   7/1994

OTHER PUBLICATIONS

Wu, et al., "Low-Temperature Etching of Cu by Hydrogen-Based Plasmas", ACS Applied Materials Interfaces, vol. 2, No. 8, 2175-2179, 2010, published on Jul. 16, 2010.

* cited by examiner

*Primary Examiner* — Shamim Ahmed
*Assistant Examiner* — Bradford Gates
(74) *Attorney, Agent, or Firm* — Pearne & Gordon LLP (57) ABSTRACT

There is provided a substrate processing method capable of increasing an etching rate of a copper member without using a halogen gas. A Cu layer 40 having a smoothened surface 50 is obtained, and then, a processing gas produced by adding a methane gas to a hydrogen gas is introduced into an inner space of a processing chamber 15. Plasma is generated from this processing gas. In the inner space of the processing chamber 15, there exist oxygen radicals 52 generated when an oxide layer 42 is etched, and carbon radicals 53 generated from methane. The oxygen radicals 52 and the carbon radicals 53 are compounded to generate an organic acid, and the organic acid makes a reaction with copper atoms of the Cu layer 40. As a result, a complex of the organic acid having the copper atoms is generated, and the generated organic acid complex is vaporized.

9 Claims, 6 Drawing Sheets

SUBSTRATE PROCESSING METHOD

CROSS-REFERENCE TO RELATED APPLICATION

This application claims the benefit of Japanese Patent Application No. 2010-287595 filed on Dec. 24, 2010, and U.S. Provisional Application Ser. No. 61/432,772 filed on Jan. 14, 2011, the entire disclosures of which are incorporated herein by reference.

FIELD OF THE INVENTION

The present disclosure relates to a substrate processing method for etching copper by plasma and also relates to a storage medium.

BACKGROUND OF THE INVENTION

In order to etch copper (Cu) widely used as a wiring material for a semiconductor device, a halogen gas, a halogen compound gas or a gas containing an ammonia ($NH_3$) gas or a nitrogen ($N_2$) gas in addition to the halogen gas or the halogen compound gas have been used as a processing gas in a high temperature environment. Since, however, the halogen gas or the halogen compound gas generates strong acid, components of a substrate processing apparatus easily corrodes in the high temperature environment.

In view of this problem, there has been proposed a method for etching a wiring or a layer made of copper (hereinafter, referred to as a "copper member") by plasma without using a halogen gas as a processing gas (see, for example, Non-Patent Document 1). In this method, only a hydrogen gas is used as a processing gas, and a vacuum ultraviolet ray having a wavelength of about 100 nm is generated when the hydrogen plasma is generated. Further, a chemical reaction between hydrogen plasma and copper is facilitated by irradiation of the vacuum ultraviolet ray. As a result, a compound of copper and hydrogen is generated. Then, copper is etched by vaporizing the compound of hydrogen and copper.

Non-Patent Document 1: Fangyu Wu, Galit Levitin, and Dennis W. Hess, "Low-Temperature Etching of Cu by Hydrogen-Based Plasmas", ACS APPLIED MATERIALS INTERFACES, VOL. 2, No. 8, 2175-2179, 2010, published on Jul. 16, 2010

In the above method, however, an etching rate of the copper member is low and, thus, the method has been considered to be lack of practicality.

BRIEF SUMMARY OF THE INVENTION

In view of the foregoing problem, the present disclosure provides a substrate processing method capable of increasing an etching rate of a copper member without using a halogen gas.

In accordance with an aspect of the present disclosure, there is provided a substrate processing method performed in a substrate processing apparatus for performing a plasma etching process on a substrate. The substrate processing method includes performing a main etching process that generates plasma from a processing gas produced by adding a gas of a carbon compound to a hydrogen gas, and etches a copper member of the substrate by the plasma.

The substrate processing method may further include, prior to performing a main etching process, performing an oxygen-containing layer etching process for etching an oxygen-containing layer of the substrate.

The substrate processing method may further include, after performing an oxygen-containing layer etching process and before performing a main etching process, performing a foreign substance removing process for removing a foreign substance from a surface of the copper member.

In performing a foreign substance removing process, plasma may be generated from a processing gas produced by adding a rare gas to a hydrogen gas.

Further, the rare gas may be an argon gas.

Furthermore, the carbon compound may be methane or carbon monoxide.

The substrate processing apparatus may be a capacitively coupled substrate processing apparatus including two facing electrodes parallel to each other. Here, the plasma is generated between the two electrodes, and the plasma etching process is performed on the substrate mounted on one of the two electrodes by using the plasma.

In accordance with the present disclosure, the copper member is etched by the plasma generated from the processing gas produced by adding the carbon compound gas to the hydrogen gas. Accordingly, since carbon radicals as well as the hydrogen plasma exist in the etching of the copper member, a great amount of organic acid complex containing copper atoms may be generated from the copper member. Further, since the organic acid complex is readily vaporized, it is possible to remove a large number of copper atoms from the copper member. Thus, it may be possible to improve an etching rate of the copper member without using a halogen gas.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 2(A) shows a substrate structure before the plasma etching process is performed, and FIG. 2(B) shows a substrate structure after the plasma etching process is performed;

FIG. 5(A) illustrates a plasma generation state in a capacitively coupled substrate processing apparatus, and FIG. 5(B) illustrates a plasma generation state in an inductively coupled substrate processing apparatus.

DETAILED DESCRIPTION OF THE INVENTION

Hereinafter, illustrative embodiments of the present disclosure will be described with reference to the accompanying drawings.

Figure 1:
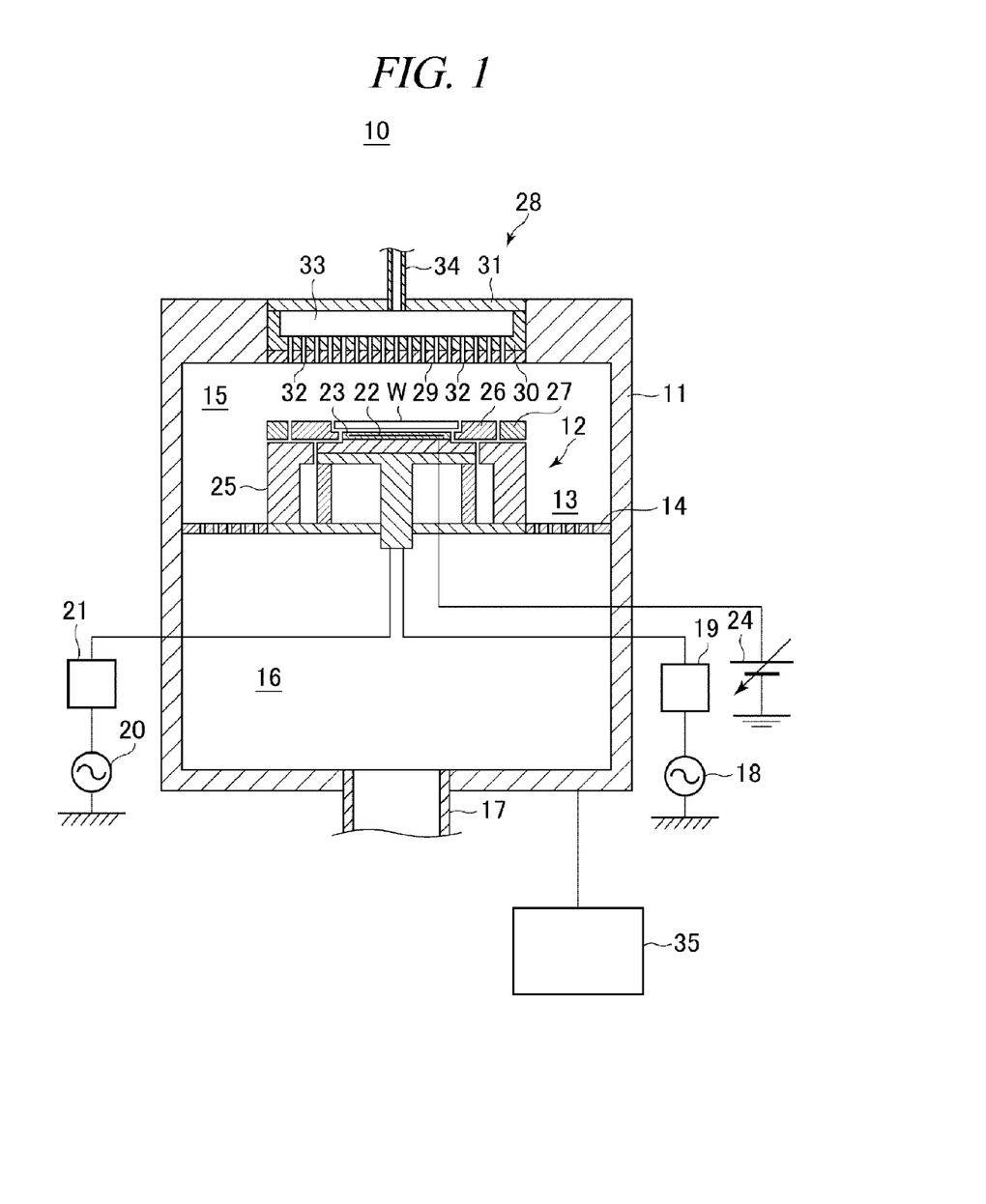
FIG. 1 is a schematic configuration view of a substrate processing apparatus configured to perform a substrate processing method in accordance with an illustrative embodiment of the present disclosure.

FIG. 1 is a schematic configuration view of a substrate processing apparatus configured to perform a substrate processing method in accordance with an illustrative embodiment of the present disclosure. In accordance with the illustrative embodiment of the present disclosure, the substrate processing apparatus performs a plasma etching process on a wafer as a substrate for a semiconductor device (hereinafter, simply referred to as a "wafer").

In FIG. 1, a substrate processing apparatus 10 includes a chamber 11 for accommodating therein a wafer W having a diameter of, e.g., about 300 mm. A circular column-shaped susceptor 12 for mounting thereon the wafer W is provided in the chamber 11. In this substrate processing apparatus 10, a side exhaust path 13 is formed between an inner sidewall of the chamber 11 and a side surface of the susceptor 12. An exhaust plate 14 is provided on the way of the side exhaust path 13.

The exhaust plate 14 is a plate-shaped member having a multiple number of through holes. The exhaust plate 14 serves as a partition plate that partitions the inside of the chamber 11 into an upper portion and a lower portion. As will be described later, plasma is generated in an inner space within the upper portion 15 (hereinafter, referred to as a "processing chamber") of the chamber 11 above the exhaust plate 14. Further, an exhaust pipe 17 for exhausting a gas within the chamber 11 is connected to the lower portion 16 (hereinafter, referred to as an "exhaust chamber (manifold)") of the inside of the chamber 11 below the exhaust plate 14. The exhaust plate 14 confines or reflects the plasma generated in the processing chamber 15, thus preventing leakage of the plasma into the manifold 16.

The exhaust pipe 17 is connected with a TMP (Turbo Molecular Pump) and a DP (Dry Pump) (both are not shown). These pumps evacuate and depressurize the inside of the chamber 11. To elaborate, the DP depressurizes the inside of the chamber 11 to an intermediate vacuum state (e.g., about $1.3 \times 10$ Pa (0.1 Torr) or less) from an atmospheric pressure. Further, in cooperation with the DP, the TMP further depressurizes the inside of the chamber 11 to a high vacuum state (e.g., about $1.3 \times 10^{-3}$ Pa ($1.0 \times 10^{-5}$ Torr) or less) lower than the intermediate pressure state. The internal pressure of the chamber 11 is controlled by an APC valve (not shown).

The susceptor 12 within the chamber 11 is connected with a first high frequency power supply 18 via a first matching unit 19 and also connected with a second high frequency power supply 20 via a second matching unit 21. The first high frequency power supply 18 is configured to apply a high frequency power of a relatively low frequency for ion attraction (e.g., about 13 MHz) to the susceptor 12, and the second high frequency power supply 20 is configured to apply a high frequency power of a relatively high frequency for plasma generation (e.g., about 40 MHz) to the susceptor 12. In this configuration, the susceptor 12 may serve as an electrode. Further, the first and second matching units 19 and 21 may reduce reflection of the high frequency powers from the susceptor 12, thus improving the efficiency of applying the high frequency powers to the susceptor 12.

A step-shaped portion is formed at a periphery of a top portion of the susceptor 12 such that a central portion of the susceptor 12 protrudes upward. Provided at a top end of the central portion of the susceptor 12 is an electrostatic chuck 23 made of ceramics and having an electrostatic electrode plate 22 therein. The electrostatic electrode plate 22 is connected with a DC power supply 24. If a positive DC voltage is applied to the electrostatic electrode plate 22, a negative potential would be generated in a surface (hereinafter, referred to as a "rear surface") of the wafer W facing the electrostatic chuck 23. Therefore, a potential difference is generated between the electrostatic electrode plate 22 and the rear surface of the wafer W. As a result, the wafer W can be attracted to and held on the electrostatic chuck 23 by a Coulomb force or a Johnsen-Rahbek force generated by the potential difference.

Further, the susceptor 12 has therein a cooling device (not shown) of a coolant path. In the present embodiment, the cooling device is configured to absorb, via the susceptor 12, heat of the wafer W of which temperature increases as a result of its contact with the plasma. Therefore, the temperature of the wafer W is prevented from increasing over a desired level.

The susceptor 12 may be made of a conductor such as aluminum in consideration of its heat transfer efficiency or its function as an electrode. Further, in order to prevent the conductor from being exposed to the processing chamber in which the plasma is generated, disposed at the side surface of the susceptor 12 is a side protection member 25 made of a dielectric material such as, but not limited to, quartz ($SiO_2$).

At a top portion of the susceptor 12, a focus ring 26 is placed on the step-shaped portion of the susceptor 12 and the side protection member 25 so as to surround the wafer W attracted to and held on the electrostatic chuck 23. A shield ring 27 is placed on the side protection member 25 so as to surround the focus ring 26. The focus ring 26 is made of silicon (Si) or silicon carbide (SiC), and, thus, a distribution range of the plasma can be expanded to above the focus ring 26 as well as above the wafer W.

A shower head 28 is provided at a ceiling of the chamber 11 so as to face the susceptor 12. The shower head 28 includes an upper electrode plate 29; a cooling plate 30 that supports the upper electrode plate 29 in a detachable manner; and a cover 31 that covers the cooling plate 30. The upper electrode plate 29 is a circular plate-shaped member having a multiple number of gas holes 32 formed in a thickness direction thereof. A buffer room 33 is formed within the cooling plate 30, and a processing gas inlet pipe 34 is connected to the buffer room 33. In this substrate processing apparatus 10, the shower head 28 and the susceptor 12 are arranged such that top surfaces of the upper electrode plate 29 and the susceptor 12 are parallel to each other.

The substrate processing apparatus 10 also includes a controller 35. The controller 35 implements the plasma etching process by controlling an operation of each component of the substrate processing apparatus 10 based on programs stored in a memory embedded therein. To be more specific, the controller 35 controls the operation of each component as follows. A processing gas supplied into the buffer room 33 via the processing gas inlet pipe 34 is introduced into the inner space of the processing chamber 15. The introduced processing gas is excited into plasma by the high frequency power for plasma generation applied into the inner space of the processing chamber 15 from the second high frequency power supply 20 via the susceptor 12. Ions in the plasma are attracted toward the wafer W by the high frequency power for ion attraction applied to the susceptor 12 from the first high frequency power supply 18, and, thus, the plasma etching process is performed on the wafer W.

Figure 2:
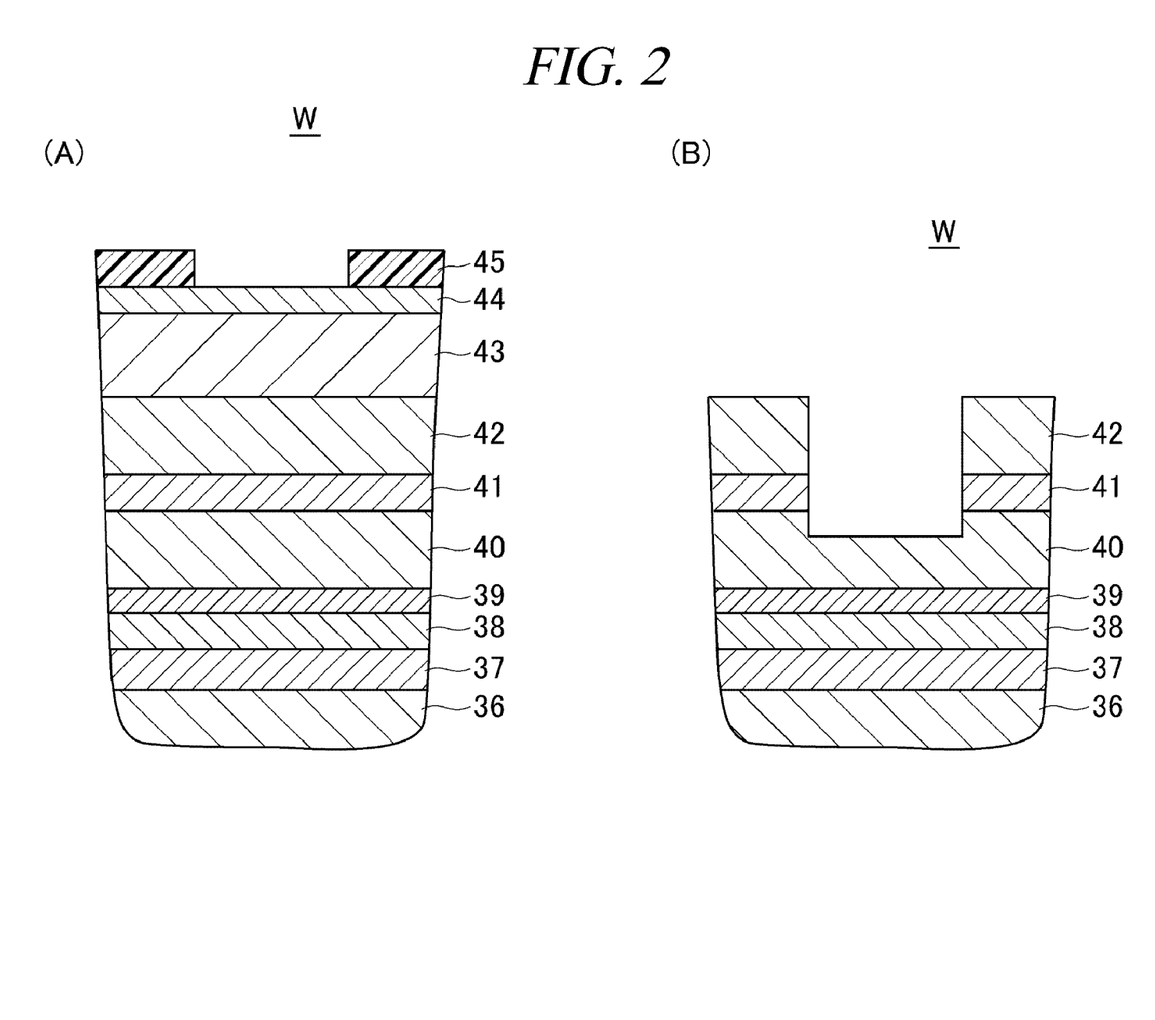
FIG. 2 is a partial cross sectional view schematically illustrating a structure of a substrate on which a plasma etching process is performed by the substrate processing apparatus of FIG. 1.

FIG. 2 is a partial cross sectional view schematically illustrating a structure of a substrate on which a plasma etching process is performed by the substrate processing apparatus shown in FIG. 1. FIG. 2(A) illustrates a substrate structure before the plasma etching process is performed, and FIG. 2(B) illustrates a substrate structure after the plasma etching process is performed.

Referring to FIG. 2(A), the wafer W has, on a base 36 made of silicon, a TEOS (Tetra Ethyl Ortho Silicate) layer 37, a low-k layer 38, a tungsten (Ta) layer 39, a Cu layer (copper member), a low-k layer 41, an oxide layer 42 (an oxygen-containing layer), an organic dielectric (ODL) layer 43, a Si-ARC layer 44 and a photoresist layer 45 that are stacked in sequence from the bottom. The low-k layer 38 is made of, e.g., BLOk (a product name produced by Applied Materials, Inc.). The Si-ARC layer 44 serves as a hard mask and an antireflection film. The photoresist layer 45 has a preset opening pattern.

When the plasma etching process is performed in the substrate processing apparatus 10, the photoresist layer 45, the Si-ARC layer 44 and the organic dielectric layer 43 are etched, and the opening pattern of the photoresist layer 45 is transcribed to the oxide layer 42 and the low-k layer 41. As a result, a part of the Cu layer 40 is exposed (FIG. 2(B)).

Figure 3:
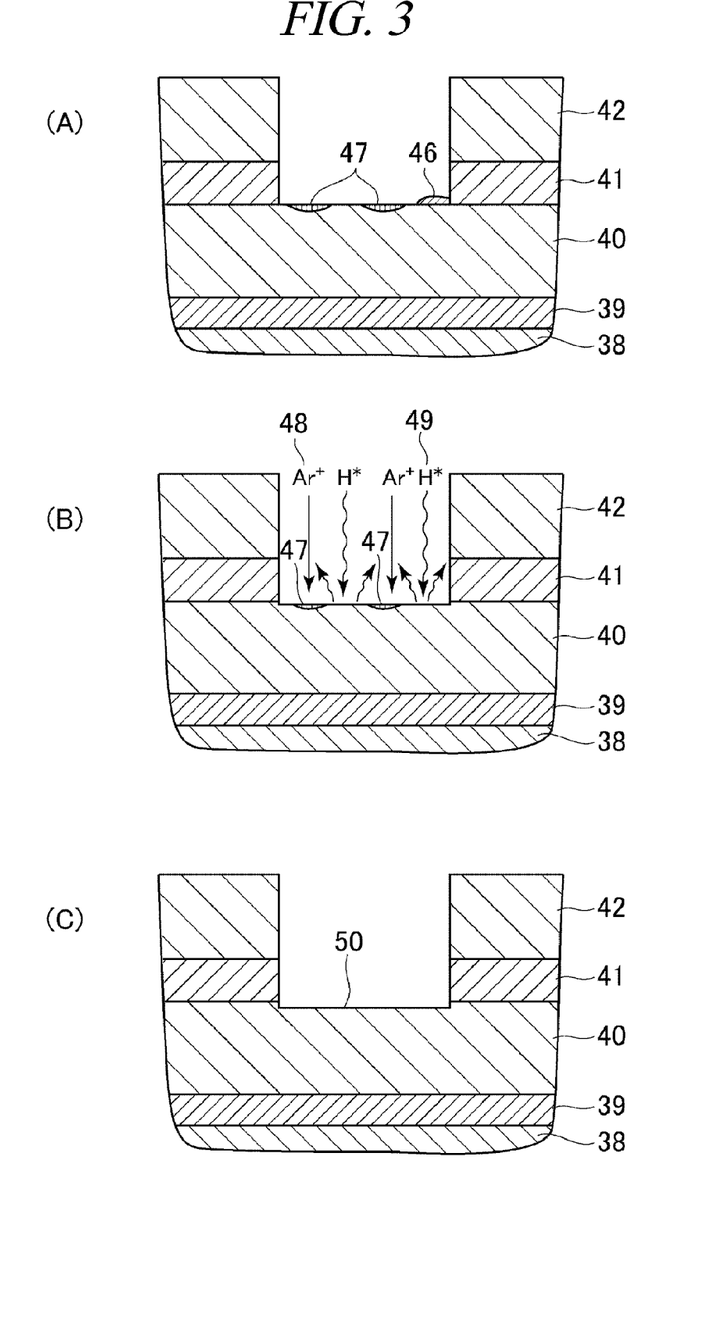
FIG. 3 shows process diagrams for illustrating a process of removing an organic material or an oxide on a surface of a Cu layer.

At this time, as illustrated in FIG. 3(A), an organic material 46 generated by the etching of the organic dielectric layer 43 and an oxide (not shown) generated by the etching of the oxide layer 42 or the low-k layer 41 are partially deposited on an exposed surface of the Cu layer 40. Further, an oxide 47 such as CuO generated by the reaction between the part of the surface of the Cu layer 40 and oxygen in the processing chamber 15 is formed in the surface of the Cu layer 40. Since the organic material 46 or the oxide 47 cannot be etched by hydrogen plasma, the organic material 46 or the oxide 47 serves as a mask in a main etching of the Cu layer 40. As a result, portions of the Cu layer 40 covered with the organic material 46 or the oxide 47 are prevented from being etched, and an etching rate of the Cu layer 40 becomes lowered.

Further, a chemical reaction between the hydrogen plasma and copper is so weak that the reaction hardly occurs if there is no energy supply from a vacuum ultraviolet ray. Thus, there is a concern that the etching rate of the Cu layer 40 cannot be improved only by generating a compound of copper and hydrogen to etch copper.

In this regard, the present inventor has conducted many researches and found out that it is possible to increase the etching rate of the Cu layer 40 without using a halogen gas by performing, prior to the main etching of the Cu layer 40, a plasma etching process on the wafer W by using plasma generated from a processing gas produced by adding a rare gas to a hydrogen gas, then, by performing, in the main etching of the Cu layer 40, a plasma etching process on the wafer W by using plasma generated from a processing gas produced by adding a carbon compound gas to a hydrogen gas, such as a methane (CH$_4$) gas or a carbon monoxide (CO) gas. The present disclosure is based on such researches.

FIGS. 3(A) to 3(C) are process diagrams for illustrating a process of etching the organic material or oxide on the surface of the Cu layer.

In the substrate processing apparatus 10, the organic material 46 generated by the etching of the organic dielectric layer 43 or oxygen generated by the etching of the oxide layer 42 floats around in the inner space of the processing chamber 15. The organic material 46 adheres to some positions on the surface of the Cu layer 40, and the oxide 47 is generated at some positions in the surface of the Cu layer 40. That is, the organic material 46 or the oxide 47 partially exists on the surface of the Cu layer 40.

In a substrate processing method in accordance with the present embodiment, after the oxide layer 42 and the low-k layer 41 is etched, a processing gas produced by adding a rare gas such as argon (Ar) to a hydrogen gas is introduced into the inner space of the processing chamber 15. Plasma is generated from this processing gas. At this time, positive argon ions 48 generated from the processing gas are attracted into the Cu layer 40 by a high frequency power for ion attraction applied to the susceptor 12 and sputter the entire surface of the Cu layer 40. Since, however, copper cannot be sputtered and etched by the positive ions of the rare gas, only the organic material 46 or the oxide 47 is selectively removed (FIG. 3(B)).

If only the organic material 46 or the oxide 47 is removed, portions of the Cu layer 40 from which the oxide 47 is removed may be left as grooves, and the surface of the Cu layer 40 may be roughened. In accordance with the present embodiment, however, hydrogen radicals 49 are generated from the processing gas and a vacuum ultraviolet ray generated when the plasma is generated from the processing gas is irradiated to the surface of the Cu layer 40. Accordingly, a chemical reaction between the hydrogen radicals 49 and copper progresses to some extent, and, thus, the surface of the Cu layer 40 is also etched by vaporization of a compound of copper and hydrogen (FIG. 3(B)), though an etching amount thereof is very small.

Accordingly, through the sputtering by the positive argon ions 48 and the chemical reaction between the hydrogen radicals and the copper, it is possible to obtain the Cu layer 40 having a smoothened surface 50 (FIG. 3(C)). As a result, in the subsequent main etching process of the Cu layer 40, the organic material 46 or the oxide 47 does not serve as a mask and, hence, the etching of the Cu layer 40 is not impeded.

Figure 4:
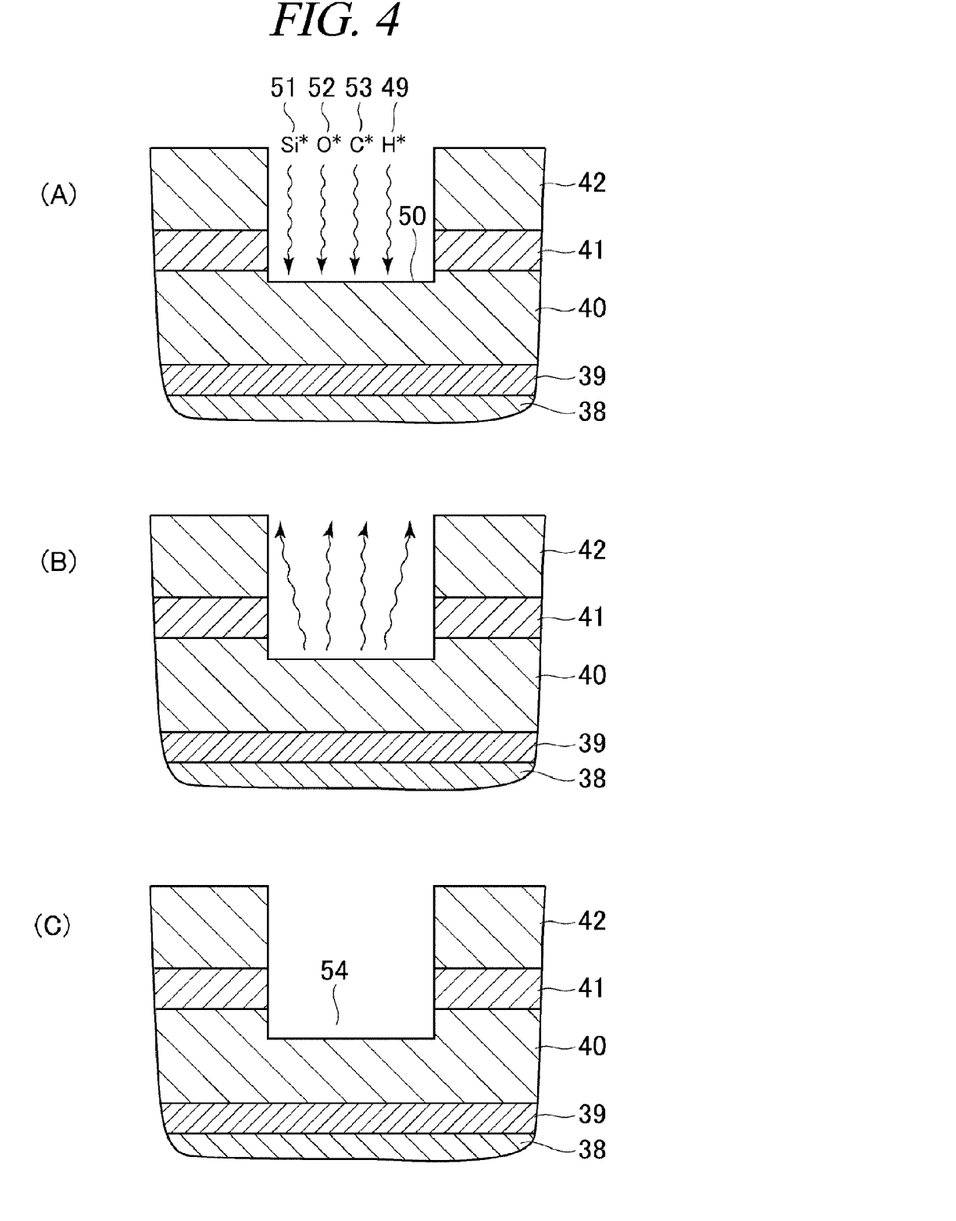
FIG. 4 shows process diagrams for illustrating a main etching process of the Cu layer.

FIGS. 4(A) to 4(C) are process diagrams for illustrating the main etching process of the Cu layer.

After the Cu layer 40 having the smoothened surface 50 is obtained through the process illustrated in FIGS. 3(A) to 3(C), a processing gas produced by adding a carbon compound, e.g., a methane gas, to a hydrogen gas is introduced into the inner space of the processing chamber 15. Plasma is generated from this processing gas.

At this time, in the inner space of the processing chamber 15, there exist silicon (Si) radicals 51 or oxygen (O) radicals 52 generated when the oxide layer 42 is etched, and there also exist carbon (C) radicals 53 generated from methane (FIG. 4(A)).

The oxygen radicals 52 and the carbon radicals 53 are compounded to generate organic acid, and the organic acid makes a reaction with copper atoms of the Cu layer 40. As a result, a complex of the organic acid having the copper atoms, such as Cu(COO), is generated. Since the reaction between the organic acid and the copper atoms is a corrosion reaction, the reaction takes place relatively easily. Further, since a saturation vapor pressure of the generated organic acid complex is low, the organic acid complex is vaporized even under a low-temperature and low-pressure condition (FIG. 4(B)). Accordingly, through the vaporization of the organic acid complex, the copper atoms can be removed from the Cu layer 40. That is, it is possible to etch the Cu layer 40 chemically.

Thereafter, the generation of the organic acid complex having the copper atoms and the vaporization of the organic acid complex continue for a preset time, e.g., about 1200 seconds, and the main etching process is completed. Through this process, a trench 54 or hole having a preset depth can be formed in the Cu layer 40 (FIG. 4(C)).

In the process shown in FIGS. 4(A) to 4(C), since a generation amount of the organic acid complex increases in proportion to an amount of the added methane gas, it may be desirable to increase the amount of the added methane gas in order to etch the Cu layer 40 at a high etching rate by the vaporization of the organic acid complex. Meanwhile, since the vaporization amount of the organic acid complex increases with the increase of the amount of the added methane gas, a great amount of deposits may be generated by re-condensation of the vaporized organic acid complex. Accordingly, in order to suppress the generation of such deposits, it may be desirable to limit the amount of the added methane gas. To be specific, a flow rate ratio of the methane gas to the hydrogen gas may be set to be in the range of, desirably, about 2.5% to about 12.5%, and, more desirably, about 5% to about 10%. By way of example, when a flow rate of the hydrogen gas is about 400 sccm, a flow rate of the methane gas may be set to be in the range of, desirably, about 10 sccm to about 50 sccm, and, more desirably, about 20 sccm to about 40 sccm.

In the process of FIGS. 4(A) to 4(C), it may be possible to add a carbon monoxide gas instead of the methane gas to the hydrogen gas. In such a case, in the inner space of the processing chamber 15, there exist the oxygen radicals 52 generated when the oxide layer 42 is etched, and there also exist carbon radicals 53 generated from the carbon monoxide. Accordingly, an organic acid complex having copper atoms can be generated, and the Cu layer 40 can be chemically etched through vaporization of this organic acid complex. Thus, it is still possible to obtain the Cu layer 40 having therein a trench 54 or hole of a preset depth.

When the carbon monoxide gas is added to the hydrogen gas, a flow rate ratio of the carbon monoxide gas to the hydrogen gas may be set to be in the range of, desirably, about 25% to about 75%, and, more desirably, about 37.5% to about 62.5% in order to etch the Cu layer 40 at a high etching rate while suppressing generation of deposits. By way of example, when a flow rate of the hydrogen gas is about 400 sccm, a flow rate of the carbon monoxide gas may be set to be in the range of, desirably, about 100 sccm to about 300 sccm, and, more desirably, about 150 sccm to about 250 sccm.

Further, in the process of FIGS. 4(A) to 4(C), a corrosion reaction between the organic acid and the copper atoms is made. Since the corrosion reaction takes place relatively easily, it is not necessary to heat the wafer W to facilitate the reaction. Instead, the temperature of the susceptor 12 only needs to be set to be in the range of, e.g., about a room temperature (about 20°) to about 60° by the cooling device of the susceptor 12.

In the process of FIGS. 4(A) to 4(C), since the Cu layer 40 given the smoothed surface 50 through the process of FIGS. 3(A) to 3(C) is etched, it is possible to etch the Cu layer 40 uniformly. Accordingly, it is also possible to form the trench 54 or hole in the Cu layer 40 exactly in a desired shape.

Moreover, in the process of FIGS. 4(A) to 4(C), the Cu layer 40 is etched not only by the generation of the organic acid complex having the copper atoms and the vaporization of the organic acid complex but also by the chemical reaction between the hydrogen radicals 49 and the copper. Since energy by irradiation of a vacuum ultraviolet ray is required for the chemical reaction between the hydrogen plasma and the copper, an etching rate of the Cu layer 40 by the chemical reaction between the hydrogen plasma and the copper may become nonuniform if a distribution of an irradiation amount of the vacuum ultraviolet ray is not uniform.

Figure 5:
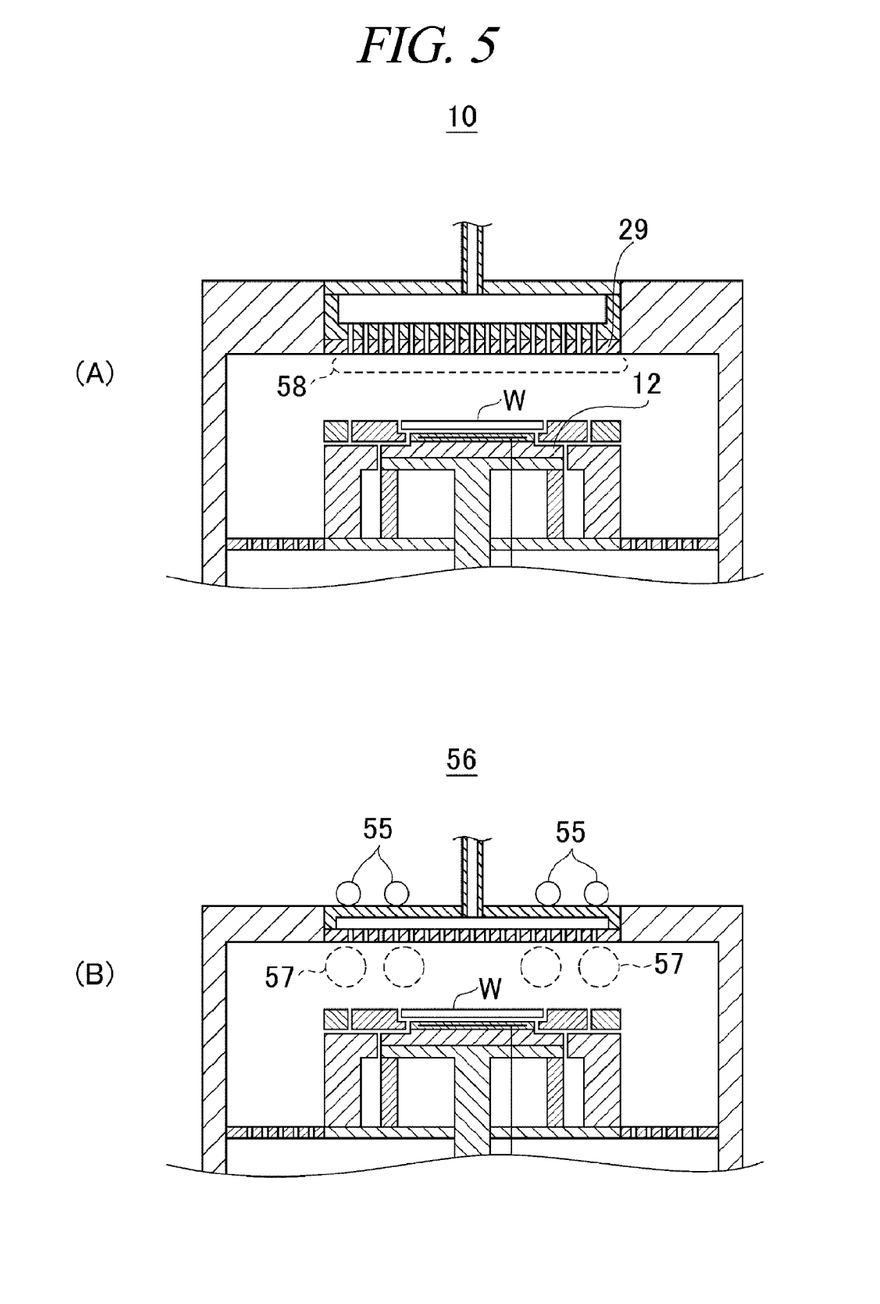
FIG. 5 is a diagram for describing a plasma generation state in a substrate processing apparatus.

For example, referring to FIG. 5(B), in an inductively coupled substrate processing apparatus 56, a spiral induction coil 55 is provided at a top portion of a chamber 11 and a high frequency power is applied to the induction coil 55. Since plasma 57 is generated in a region corresponding to the induction coil 55, an irradiation amount of the vacuum ultraviolet ray becomes increased in a region corresponding to the induction coil 55. As a result, an etching rate of a portion of the Cu layer 40 facing the induction coil 55 becomes increased, resulting in a failure to etch the entire Cu layer 40 uniformly.

Meanwhile, the substrate processing apparatus 10 that performs the process of FIGS. 4(A) to 4(C) is configured as a capacitively coupled plasma processing apparatus as illustrated in FIG. 5(A). In the capacitively coupled plasma processing apparatus, plasma is generated in a substantially uniform manner between the upper electrode plate and the top surface of the susceptor that are arranged to face each other. That is, the plasma 58 can be uniformly distributed between the upper electrode plate 29 and the susceptor 12. Hence, the distribution of the irradiation amount of the vacuum ultraviolet ray can also be made uniform, and, thus, the entire Cu layer 40 on the wafer W can be etched uniformly.

Figure 6:
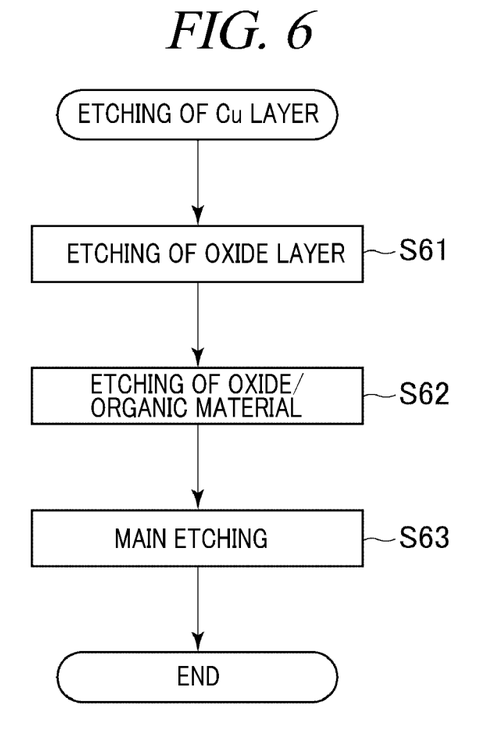
FIG. 6 is flowchart for describing a Cu layer etching process which is a substrate processing method in accordance with the illustrative embodiment of the present disclosure.

FIG. 6 is a flowchart for illustrating a Cu layer etching process which is a substrate processing method in accordance with the present embodiment. The Cu layer etching process is performed while the controller 35 controls each component of the substrate processing apparatus 10 according to preset programs.

Referring to FIG. 6, first, the Si-ARC layer 44, the organic dielectric layer 43, the oxide layer 42 and the low-k layer 41 are etched by using the photoresist layer 45 as a mask (step S61) (oxygen-containing layer etching process). At this time, since an oxygen-containing layer such as the oxide layer 42 is etched, the oxygen radicals 52 are generated in the inner space of the processing chamber 15. Further, since the low-k layer 41 is etched and removed, the Cu layer 40 is exposed. On the surface of the Cu layer 40, the organic material 46 or the oxide 47 may be partially provided, as mentioned above (FIG. 3(A)).

Then, an oxide and organic material etching process, which is the process described in FIGS. 3(A) to 3(C), is performed (step S62) (foreign substance removing process). Further, the surface of the Cu layer 40 is also etched in a very small amount, so that the Cu layer 40 having the smoothened surface 50 is obtained (FIG. 3(C)).

Subsequently, a Cu layer main etching process, which is the process described in FIGS. 4(A) to 4(C), is performed (step S63) (main etching process). As a result, the trench 54 or hole of the preset depth is formed in the Cu layer 40 (FIG. 4(C)). Then, the process is completed.

According to the process of FIG. 6, the Cu layer 40 is chemically etched by the plasma generated from the processing gas produced by adding the methane gas and the hydrogen gas. Accordingly, during the etching of the Cu layer 40, since the carbon radicals 53 as well as the hydrogen radicals 49 exist, a great amount of organic acid complex having copper atoms is generated from the Cu layer 40. Since the organic acid complex is readily vaporized, it is possible to chemically remove a large number of copper atoms from the Cu layer 40. Thus, the etching rate of the Cu layer 40 can be improved.

Moreover, in the process of FIG. 6, since the oxide layer 42 or the like is etched prior to the main etching process of the Cu layer 40, the oxygen radicals 52 exist during the main etching process of the Cu layer 40. Accordingly, the organic acid complex can be surely generated.

In addition, according to the process of FIG. 6, since the oxide 47 or the organic material 46 is removed from the surface of the Cu layer 40 prior to the main etching process of the Cu layer 40, there exists no matter that impedes the main etching process of the Cu layer 40. Accordingly, the etching rate of the Cu layer 40 can be further enhanced.

Furthermore, according to the process of FIG. 6, since the etching rate of the Cu layer 40 can be improved without using a halogen gas, it is not necessary to worry about corrosion in the substrate processing apparatus 10. Thus, the structure of the substrate processing apparatus 10 can be simplified.

Further, in the above-described process of FIG. 6, by etching the oxide layer 42 or the like, the oxygen radicals are generated in the inner space of the processing chamber 15. However, during the main etching process of the Cu layer 40, it may be also possible to use a processing gas produced by adding, to a hydrogen gas, an oxygen-containing gas as well as a methane gas, and to generate oxygen radicals 52 from this processing gas. The gas added to the hydrogen gas during the main etching process of the Cu layer may not be limited to the methane gas or the carbon monoxide gas, but any carbon-containing gas, e.g., a carbon compound gas may be used.

Furthermore, in the above-described embodiment, the high frequency power for ion attraction and the high frequency power for plasma generation are added to the susceptor 12. However, it may be also possible to apply a high frequency power of, e.g., about 13 MHz for ion attraction to the susceptor 12 and to apply a high frequency power of, e.g., about 60 MHz for plasma generation to the upper electrode plate 29.

In the above, although the disclosure has been described with respect to the illustrative embodiment, the present disclosure is not limited thereto.

The objects of the present disclosure can be achieved by supplying a storage medium storing a software program for implementing the function of the aforementioned embodiment to a computer or the like, and by causing a CPU of the computer to read out and execute the program stored in the storage medium.

In such a case, the program itself read out from the storage medium may implement the functions of the aforementioned embodiment, and the present disclosure may be embodied by the program and the storage medium storing the program.

By way of non-limiting example, the storage medium for storing therein the program may be a RAM, a NV-RAM, a floppy (registered trademark) disk, a hard disk, a magneto-optical disk, an optical disk such as a CD-ROM, a CD-R, a CD-RW, a DVD (a DVD-ROM, a DVD-RAM, a DVD-RW, a DVD+RW), a magnetic tape, a nonvolatile memory card, another ROM, or the like. Alternatively, the program may be supplied into the computer by downloading it from another computer or database, or a computer (not shown) connected to the Internet, a commercial network, a local area network (LAN) or the like.

Further, the function of each embodiment described above can be implemented by executing the program read by the CPU of the computer, and an OS (operating system) operated on the CPU may perform a part or all of the actual process in response to instructions of the program and the function of each embodiment may be implemented by the process.

Further, the program read from the storage medium may be written in a memory of a function extension board inserted into the computer or a function extension unit connected to the computer, and a CPU of the function extension board or the function extension unit may perform a part or all of the actual process in response to instructions of the program, and the function of each embodiment may be implemented by the process.

The program may include an object code, a program executable by an interpreter, script data supplied to an OS, or the like.

What is claimed is:

1. A substrate processing method performed in a substrate processing apparatus for performing a plasma etching process on a substrate, the method comprising:
    performing an oxygen-containing layer etching process that etches an oxygen-containing layer of the substrate, thereby generating oxygen radicals; and
    performing a main etching process that generates plasma from a processing gas produced by adding a gas of a carbon compound to a hydrogen gas, and etches a copper member of the substrate by the plasma,
    wherein the oxygen radicals are compounded with carbon radicals generated from the gas of the carbon compound to generate organic acid, and the organic acid makes a reaction with copper atoms of the copper member to form a complex of the organic acid having the copper atoms.

2. The substrate processing method of claim 1, further comprising:
    after performing an oxygen-containing layer etching process and before performing a main etching process, performing a foreign substance removing process for removing a foreign substance from a surface of the copper member.

3. The substrate processing method of claim 2, wherein, in performing a foreign substance removing process, plasma is generated from a processing gas produced by adding a rare gas to a hydrogen gas.

4. The substrate processing method of claim 3, wherein the rare gas is an argon gas.

5. The substrate processing method of claim 1, wherein the gas of the carbon compound is a methane gas or a carbon monoxide gas.

6. The substrate processing method of claim 1, wherein the substrate processing apparatus is a capacitively coupled substrate processing apparatus including two facing electrodes parallel to each other,
    the plasma is generated between the two electrodes, and
    the plasma etching process is performed on the substrate mounted on one of the two electrodes by using the plasma.

7. The substrate processing method of claim 5, wherein a flow rate ratio of the methane gas to the hydrogen gas is set to be in a range of about 2.5% to about 12.5%, and a flow rate ratio of the carbon monoxide gas to the hydrogen gas is set to be in a range of about 25% to about 75%.

8. The substrate processing method of claim 5, wherein a flow rate ratio of the methane gas to the hydrogen gas is set to be in a range of about 5% to about 10%, and a flow rate ratio of the carbon monoxide gas to the hydrogen gas is set to be in a range of about 37.5% to about 62.5%.

9. The substrate processing method of claim 1, wherein the main etching process is performed without using a halogen gas.

* * * * *

UNITED STATES PATENT AND TRADEMARK OFFICE
CERTIFICATE OF CORRECTION

PATENT NO. : 8,608,974 B2
APPLICATION NO. : 13/332531
DATED : December 17, 2013
INVENTOR(S) : Eiichi Nishimura It is certified that error appears in the above-identified patent and that said Letters Patent is hereby corrected as shown below:

In the Specification

Column 4, line 15, add - 15 - between "chamber" and "in"

Column 4, line 67, add - 40 - between "layer" and "(copper)"

Column 8, line 65, add - 52 - between "radicals" and "are"

Signed and Sealed this
Fifteenth Day of April, 2014

Michelle K. Lee
*Deputy Director of the United States Patent and Trademark Office*